(12) United States Patent
Brady

(10) Patent No.: US 10,409,764 B2
(45) Date of Patent: Sep. 10, 2019

(54) COMBINATION STORAGE AND PROCESSING DEVICE

(71) Applicant: Aaron Brady, Naperville, IL (US)

(72) Inventor: Aaron Brady, Naperville, IL (US)

(\*) Notice: Subject to any disclaimer, the term of this patent is extended or adjusted under 35 U.S.C. 154(b) by 0 days.

(21) Appl. No.: 15/823,175

(22) Filed: Nov. 27, 2017

(65) Prior Publication Data

US 2018/0121119 A1    May 3, 2018

Related U.S. Application Data

(63) Continuation of application No. 14/138,160, filed on Dec. 23, 2013, now abandoned.

(51) Int. Cl.
*G06F 3/06* (2006.01)
*G11C 15/04* (2006.01)
*G11C 15/00* (2006.01)
*G06F 15/78* (2006.01)
*G06F 9/38* (2018.01)

(52) U.S. Cl.
CPC ............ *G06F 15/7821* (2013.01); *G06F 9/38* (2013.01); *G06F 9/3885* (2013.01); *G11C 15/00* (2013.01); *G11C 15/04* (2013.01)

(58) Field of Classification Search
CPC ...... G06F 3/029; G06F 3/0673; G06F 3/0604; G11C 15/04; G11C 15/00
See application file for complete search history.

(56) References Cited

U.S. PATENT DOCUMENTS

| | | | |
|---|---|---|---|
| 8,819,272 B2 | 8/2014 | Song | |
| 2005/0024983 A1* | 2/2005 | Kirsch | G06F 9/30141 365/232 |
| 2011/0093662 A1* | 4/2011 | Walker | G06F 15/7821 711/147 |

\* cited by examiner

*Primary Examiner* — Tri M Hoang
(74) *Attorney, Agent, or Firm* — Brie A. Crawford; Crawford Intellectual Property Law LLC

(57) ABSTRACT

A combination storage and processing device is disclosed. A large scale integrated circuit which incorporates both random access memory storage for individual data elements and circuits which process data elements according to a fixed set of instructions is disclosed. When directed by controlling software or hardware, a plurality of the individual data elements stored in the random access memory storage are pushed through the circuits which perform fixed operations upon the data elements and return them to random access memory storage. This allows operations to be performed on the plurality of data elements without sending them through a data bus to the central processing unit of a general purpose computing device, increasing efficiency and overall computing speed.

10 Claims, 10 Drawing Sheets

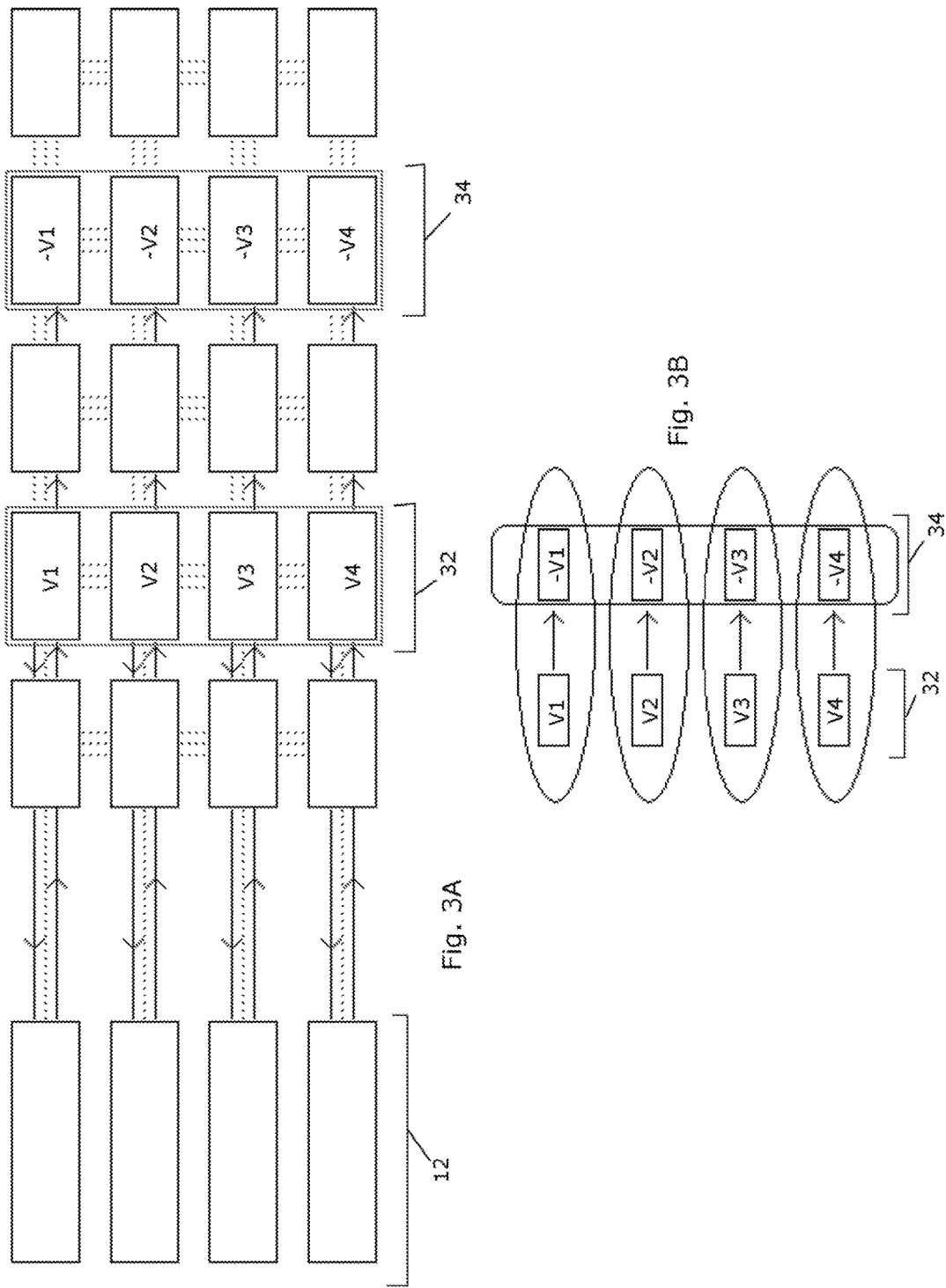

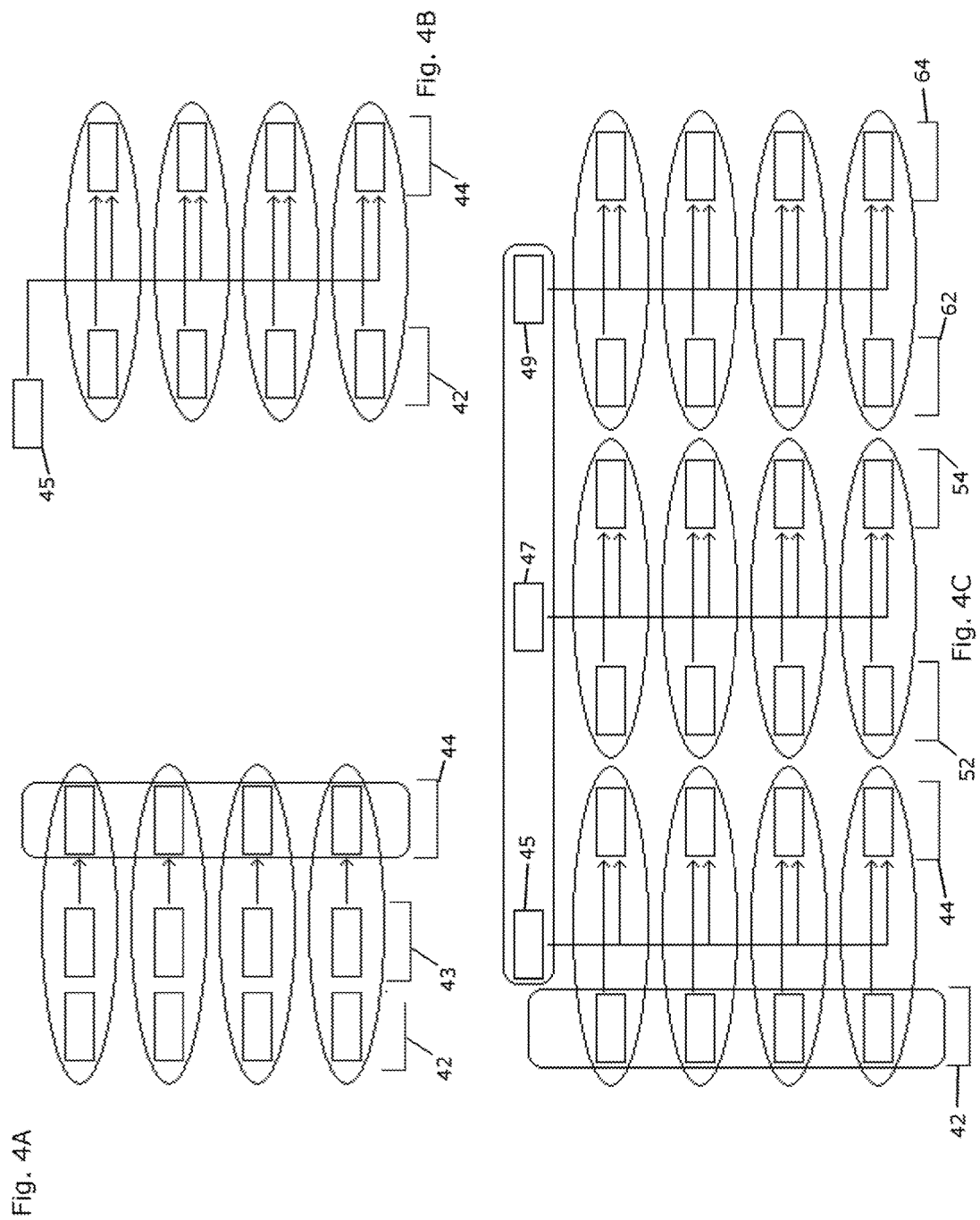

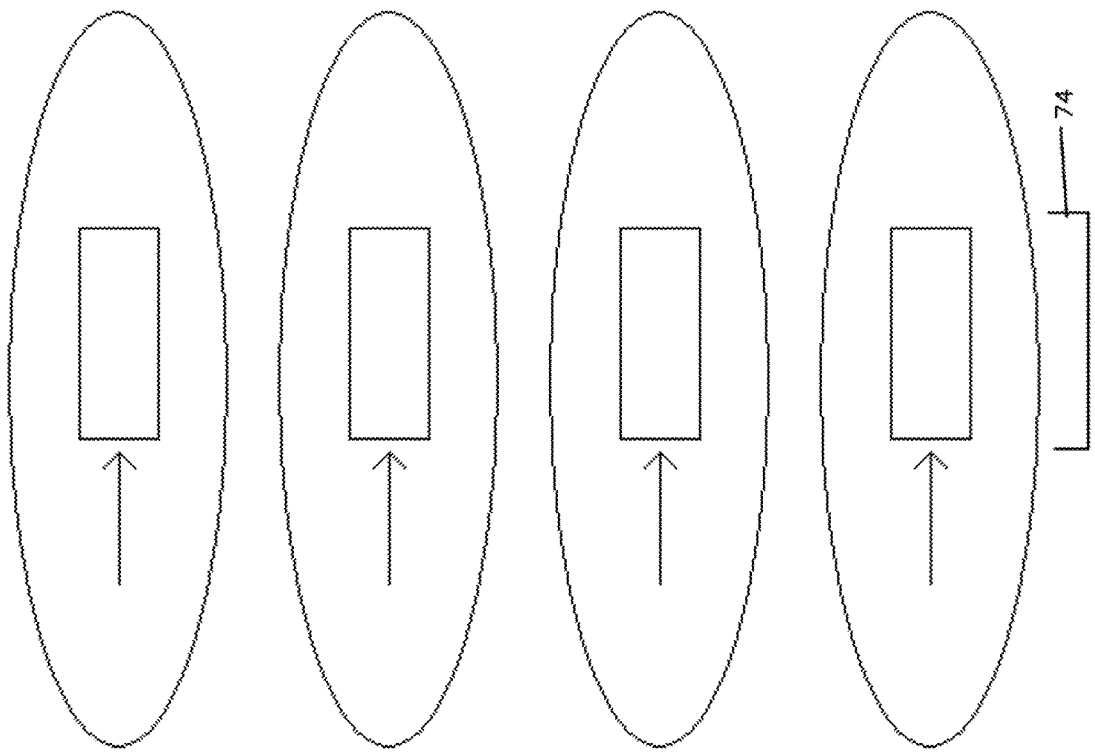

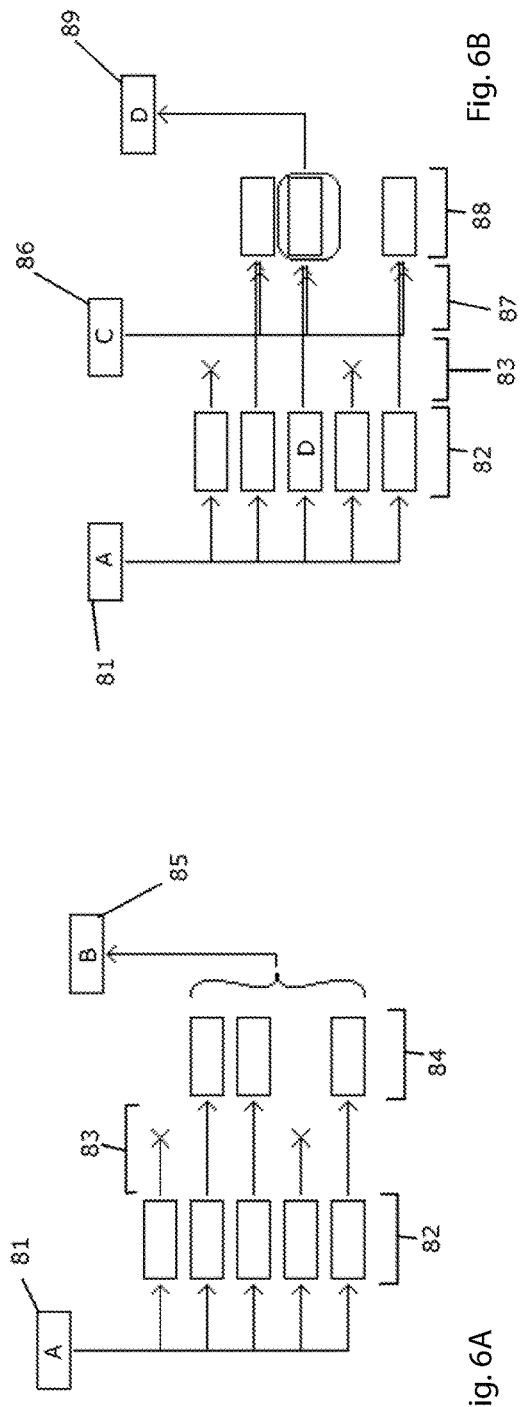
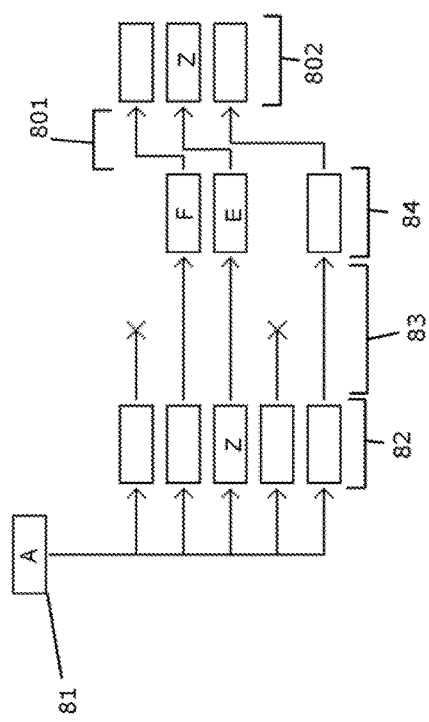
Fig. 6A
Fig. 6B
Fig. 6C

COMBINATION STORAGE AND PROCESSING DEVICE

CROSS REFERENCE TO RELATED APPLICATION AND INCORPORATION BY REFERENCE

This application claims priority to the previously filed United States of America patent application titled GRID PROCESSING ELECTRONIC MEMORY, with an application filing date of Dec. 23, 2013, in the United States Patent and Trademark Office, application Ser. No. 14/138,160, said application by the same inventive entity, with the entirety of said application being incorporated herein by reference to provide continuity of disclosure.

This application is a CONTINUATION of the previously-filed application identified above and contains no new matter.

SUBSTITUTE SPECIFICATION

This is a substitute specification as provided for in 37 C.F.R. 1.125. This specification contains no new matter.

FIELD OF THE INVENTION

This invention relates generally to a combination storage and processing device which integrates processors and random access memory on a single section of a large-scale (or higher scale) integrated circuit (LSIC.) This allows basic computing operations to be performed on data stored on the random access memory portion of the LSIC without having to move the data from the random access memory to the central processing unit of a general purpose computing device via an internal data bus.

BACKGROUND OF THE INVENTION

Modern computing devices incorporate electronic processing units which execute stored instructions upon discrete elements of data. In the most common embodiment of such a device, Read Only Memory (ROM) stores a fixed instruction set which, in essence, tells the computing device how to be a computing device. Using instructions stored in ROM, the computing device retrieves further instructions from Random Access Memory (RAM) and processes them with a Central Processing Unit (CPU.) It should be noted that due to network processing and "virtualization," any or all of the three computing device elements may or may not be in physical proximity to a given user of the computing device or to any of the other two computing device elements.

A drawback of this architecture is that CPUs work on "clock cycles," and can only execute one instruction on one set of discrete data elements per individual processing unit per clock cycle. Typically this architecture uses single-instruction single-data processing, where a single operation is performed on one or two data items per clock cycle. The two approaches to increasing overall computing speed in this architecture are: 1) To increase the number of processors, allowing more instructions to be executed in total; and/or 2) to increase the number of clock cycles per second that the CPU can execute. To illustrate the progress of the art, two examples are informative:

1) The Motorola® 6800, one of the first modern general-purpose CPUs, had the equivalent of 4,100 transistors (processors) operating at a speed of 1 MHz, or one million clock cycles per second, when introduced in 1974.
2) The Intel® Core i7, a recent-generation general-purpose CPU, had the equivalent of up to 1.9 billion transistors (processors) operating at a speed of up to 3.1 GHz, or 3.1 billion clock cycles per second, when introduced in 2015.

Increasing the number of processors in a CPU introduces a vast number of problems, including but not limited to size limitations, power consumption and heat dispersal, threading complexity, higher manufacturing error rates, and even quantum-mechanical limits arising in relation to the density of circuits in the processor. A combination storage and processing device that could increase the overall computing speed of a computing device without increasing the number of processors in the CPU, or increasing the density of the processors on the CPU, would be a useful invention.

In addition, as the number of processing units increases, the amount of information which must be moved from RAM to the CPU so it can be acted upon 5 increases. This information is moved through a CPU/RAM data bus. This is one of the major limits to overall computing speed, since data must move through the CPU/RAM data bus from the RAM to the CPU, and often back again after processing, to perform most computing tasks. A combination storage and processing device that could reduce the amount of information moving through the CPU/RAM data bus would be a useful invention.

The present invention addresses these concerns.

SUMMARY OF THE INVENTION

An objective of the present invention is the provision of a combination storage and processing device that can perform fixed operations on stored data without transferring the stored data to a dedicated processing device.

A second objective of the present invention is the provision of a combination storage and processing device that can increase the overall speed of a general purpose computing device by performing fixed operations on data stored in RAM without having to transfer the data to and from the CPU.

A third objective of the present invention is the provision of a combination storage and processing device that allows for single-instruction multiple-data operations, such that hundreds, thousands, or more data items can be processed in a single clock cycle.

These and other objectives of the present invention (which other objectives become clear by consideration of the specification, claims, and drawings as a whole) are met by a combination storage and processing device as set forth in the description of the preferred embodiment.

BRIEF DESCRIPTION OF THE DRAWINGS

FIG. 3A depicts an abstracted flow diagram of a unary operation performed using the invention.

FIG. 3B depicts an abstracted flow diagram of a unary operation performed using the invention.

FIG. 4A depicts an abstracted flow diagram of a binary operation performed using the invention.

FIG. 4B depicts an abstracted flow diagram of a binary register operation performed using the invention.

FIG. 4C depicts an abstracted flow diagram of a binary multiple register operation performed using the invention.

FIG. 5 depicts an abstracted flow diagram of a fixed conversion operation performed using the invention.

FIG. 6A depicts an abstracted flow diagram of a searching operation performed using the invention.

FIG. 6B depicts an abstracted flow diagram of a searching operation performed using the invention.

FIG. 6C depicts an abstracted flow diagram of a searching operation performed using the invention.

Throughout the figures of the drawings, where the same or similar part appears in one or more than one figure of the drawings, the same or similar number is applied thereto.

DETAILED DESCRIPTION OF THE PREFERRED EMBODIMENTS

Figure 1:
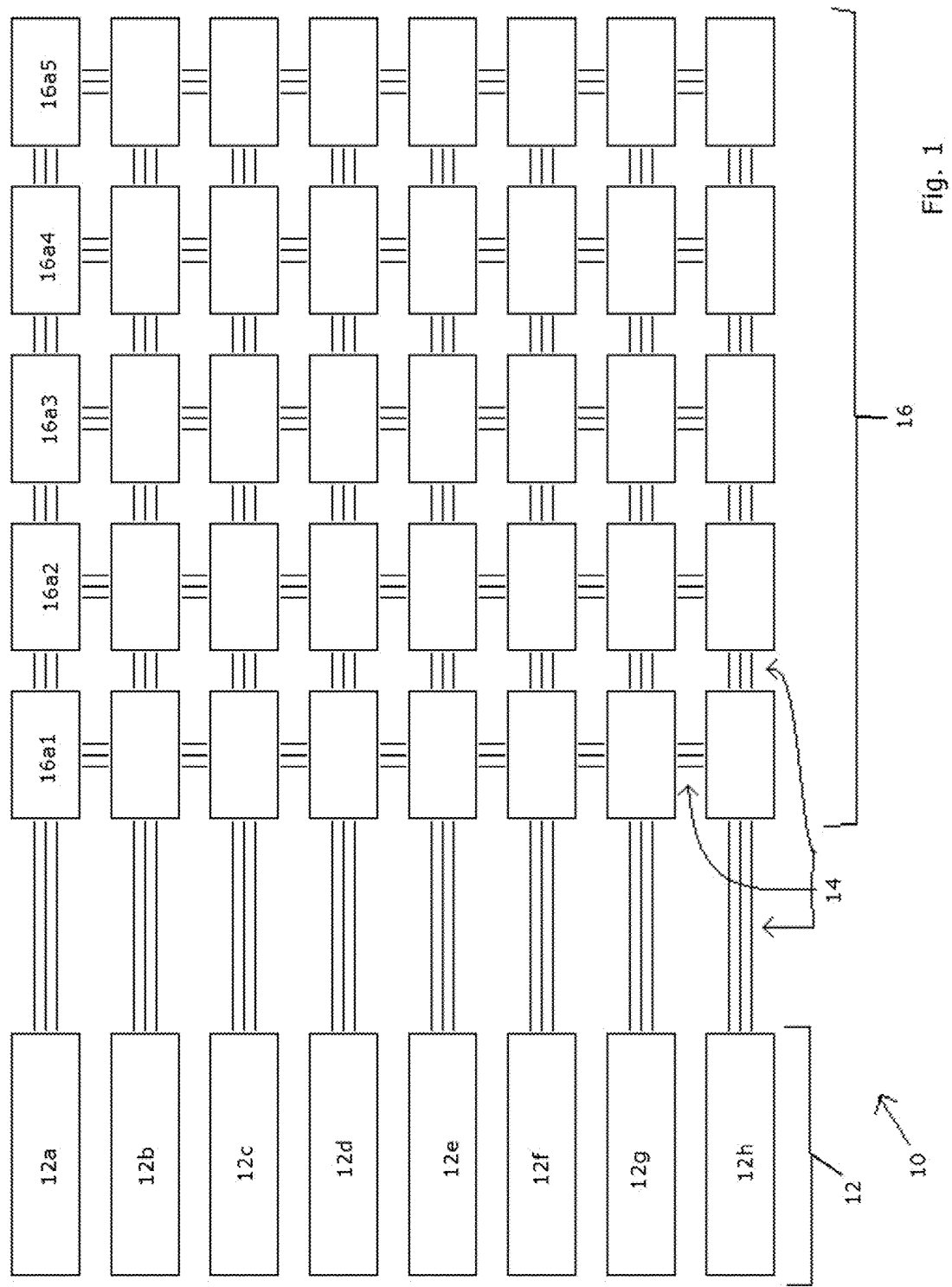
FIG. 1 depicts an abstracted schematic of a combined storage and processing device including in-line computation units, data storage elements, and the pathways between them.

Reference will now be made in detail to several embodiments of the invention that are illustrated in accompanying drawings. Whenever possible, the same or similar reference numerals are used in the drawings and the description to refer to the same or like parts or steps. The drawings are in simplified form and are not to precise scale. For purposes of convenience and clarity only, directional terms such as top, bottom, left, right, up, over, above, below, beneath, rear, and front, may be used with respect to the drawings. These and similar directional terms are not to be construed to limit the scope of the invention in any manner. The words attach, connect, couple, and similar terms with their inflectional morphemes do not necessarily denote direct or intermediate connections, but may also include connections through mediate elements or devices.

In the drawings, unless otherwise noted, closed rectangular boxes indicate individual data storage elements or "storage cells" which store individual data values, individual computation units or "in-line computation units" which contain predetermined computation instructions, or individual hybrid units which can either store individual data values or store and/or execute predetermined computation instructions. It should be clearly understood that creating data storage locations and computation units in integrated circuitry, as well as techniques for moving information into and out of them, are well-known in the art. Similarly, lines in the drawings connecting the closed rectangular boxes represent abstracted information flow pathways (or, where indicated, abstracted information flow pathways for individual data values from storage cell to storage cell passing through in-line computation units.) Moving information between individual storage locations and/or computation units in integrated circuitry is likewise well-known in the art. Therefore, the description of the preferred embodiment does not describe the actual functioning or configuration of the integrated circuitry which implements the invention. Any reasonable configuration of integrated circuitry which can implement the requirements of the invention will serve, though it is preferred to use modern silicon wafer fabrication techniques.

By referring to FIG. 1, the basic function of the invention may be easily understood. Storage and Processing Device ("SPD") 10 comprises a plurality of computation units 12a through 12h, collectively computation units 12. A plurality of storage units 16 are connected to computation units 12 through transfer pathways 14. Using techniques known in the art, once per clock cycle data values (usually stored as binary numbers, with each digit of the binary number represented by a single switch which is either on or off) stored in storage units 12 can be moved between individual storage units and/or have a computation operation performed upon them by computation units 12, with the result of the computation operation once again stored in one of the individual storage units 16.

Computation units 12 contain circuitry which performs one of a fixed plurality of computation operations. For example, a computation unit might contain circuitry which accepts a command from a software program (also referred to as "software" in this application) stored on a persistent storage device (e.g. a hard disk drive) running on a Central Processing Unit ("CPU") of a general purpose computing device ("GPCD") to which SPD 10 is operably connected (not shown) to negate a value stored in any or all of the storage units to which that computation unit is connected, to add a fixed value, a value stored in a register, or the value stored in two or more storage units to which that computation unit is directly connected by a transfer pathway. It is required that computation units 12 be operably connected to the CPU of the GPCD such that the computation units can receive instructions to perform computation operations. It is required that storage units 16 be operably connected to the CPU of the GPCD such that values can be stored in or retrieved from storage units 16 by the CPU. Both of these connections can be direct or through a data bus of any reasonable type: for purposes of this application it will be assumed that such connections are made through an internal data bus ("IDB.") If the device of the invention is integrated into a general purpose computing device, the IDB may share components with one or more other bus systems, such as the CPU/RAM data bus if the general purpose computing device includes RAM.

Computation units 12 are connected via transfer pathways 14 to a row of storage units. As all descriptions of the preferred embodiment herein use one or two dimensional configurations, unless otherwise specified, "horizontal" pathways refer to pathways which move from left to right and vice versa and "vertical" pathways refer to pathways which move from top to bottom and vice versa. It is preferred, but not required, for transfer pathways (not shown) which travel from layer to layer to also exist if SPD 10 comprises multiple layers of a single integrated circuit. In such a circuit, inter-layer pathways can be referred to as "vertical," or as "Z axis" whereas pathways on a single layer can be referred to as "X axis" pathways and "Y axis" pathways, or by any other reasonable appellation. Diagonal pathways, both intra-layer and inter-layer, can also be used, as will become clear from the description of the preferred embodiment. All of the features and benefits of the invention are equally applicable to storage cells and computation units arrayed along intra-layer, inter-layer, and combination pathways.

In the embodiment shown, computation unit 12a is connected to storage units 16a1 to 16a5. Thus, computation unit 12a can perform any computation operation it is capable of on any value stored in any or all storage units 16a1 to 16a5 without having to move any data through the IDB to or from the CPU. This operation can be performed in a single clock cycle. The CPU can then retrieve the new values through the IDB as is customary in the art. It is required that computation units 12 be operably connected to storage units 16 only through linear transfer pathways. It is required that no computation unit be able to perform a computation operation on a data value stored in a storage unit to which it is not operably connected.

Figure 2:
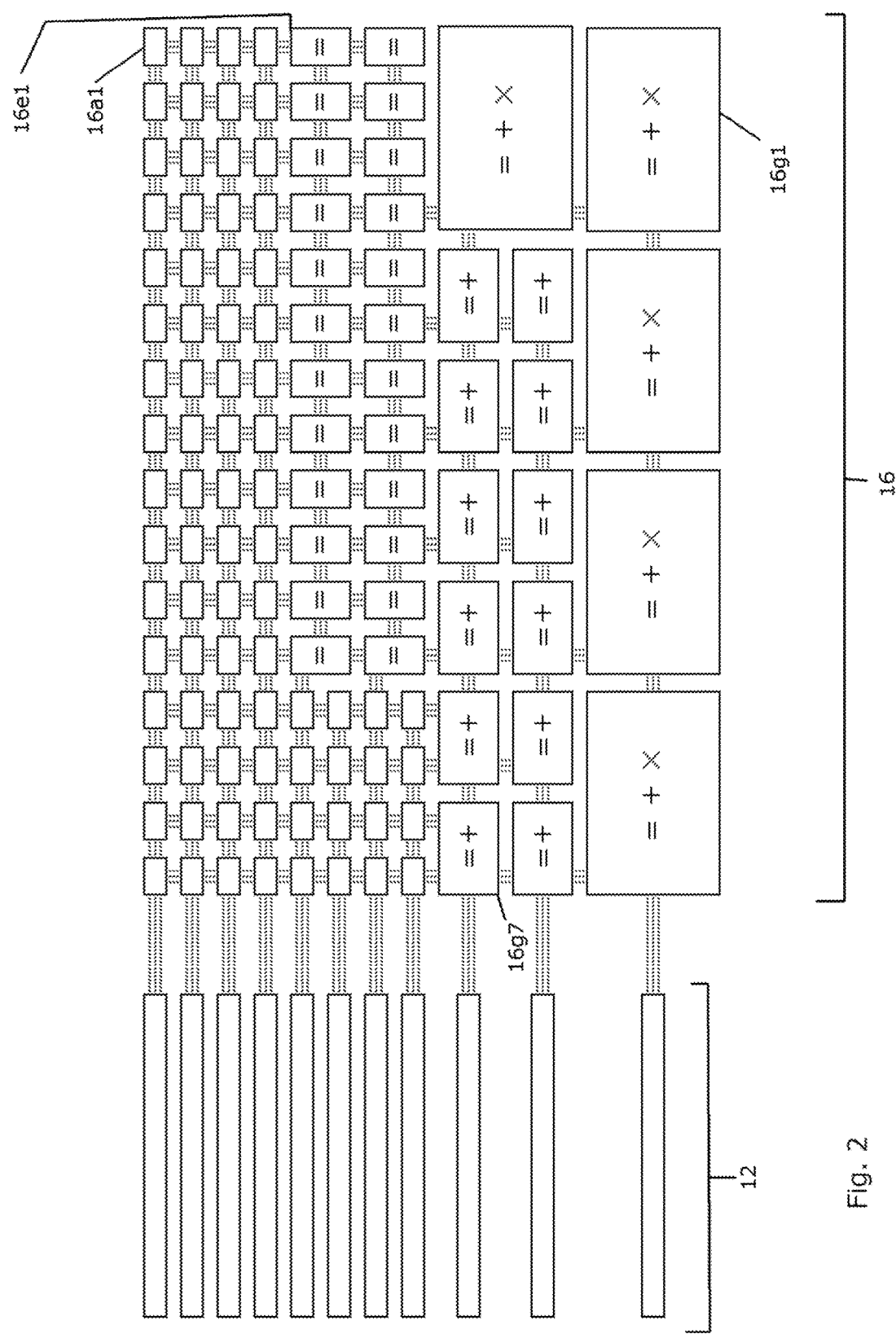
FIG. 2 depicts an abstracted schematic of a combined storage and processing device including in-line computation units, data storage elements, and the pathways between them.

FIG. 2 shows a general schematic incorporating the inventive concept into a more complex embodiment. Computation units 12 are as described above. Storage units 16 are now both pure storage units able to store some data value, such as storage cell 16a1, and hybrid units able to perform a limited number of fixed computation operations. Examples include equality checking cell 16e1, adder and equality checking cell 16g7, and adder/multiplier/equality checking cell 16g1. Data values flow from storage cells into hybrid units, each movement corresponding to a clock cycle (also referred to as an instruction cycle.) Though neither hybrid units nor computation units can perform their computation operations on data values not stored in storage cells to which they have a direct connection via transfer pathway, they can perform any single computation operation on all the storage cells to which they have a direct connection in a single clock cycle. This means that time is saved both by not having to move the data values through the CPU via the IDB, and by reducing the number of clock cycles it takes to perform the computation operation ("N") on each value from at least N=(number of data values) to N=1. For each step in the computation operation, N increases at a linear rate, but for any computation operation that can be performed on the data values stored in connected storage cells that a hybrid unit or computation unit can perform in a single clock cycle, N will remain equal to 1.

It is required that computation units 12 and hybrid units such as 16e1, 16g1, and 16g7 be operably connected to storage cells only through linear transfer pathways. It is required that no computation unit or hybrid unit be able to perform a computation operation on a data value stored in a storage cell to which it is not operably connected.

An example of the invention in use can be seen in FIGS. 3A and 3B. FIG. 3A shows the operation using a matrix of computation units and storage cells as shown above: FIG. 3B shows an abstracted representation of what happens when the operation is performed. Here the operation to be performed is a "unary" operation, specifically negation of a stored value. Upon receiving the instruction to perform the operation from the CPU (not shown) computation units 12 apply a negation operation to the values V1 through V4, which are stored in storage cells comprising column 32. The output is stored in second column 34.

It will be obvious to persons of ordinary skill in the art that any given row or column of storage units can be thought of as an array of values, as that term is commonly used in computer science. Here, column 32 is a one-dimensional array which can store a total of four values (V1-V4) and second column 34 is a one-dimensional array which stores a total of four values. Again, use of the invention reduces the number of clock cycles it takes to perform a unary operation on a one-dimensional array to N=1 from N=(number of elements,) and continues to reduce N from the linear rate increase that binary operations (or operations on two-dimensional arrays,) et cetera would normally engender to N=1 if the computation or hybrid units can perform all desired computation operations in a single instruction, or N=(number of computation operations) if computation or hybrid unit abilities must be linked to perform the desired series of computation operations.

FIGS. 4A, 4B, and 4C describe the operation of the preferred embodiment in binary computation operations (and, by extrapolation, all more complex computation operations.) In FIG. 4A, the computation units or hybrid units (here abstracted, acting at the "arrow" interfaces between units) perform a binary computation operation (here, addition) on data values stored in storage cells. Data values stored in first column 42 and second column 43 are added by a computation or hybrid unit and the result is stored to result column 44. Assuming a computation or hybrid unit for each row of storage cells, the computation operation can be performed on the entire two arrays represented by first column 42 and second column 43 in a single clock cycle. Alternatively, the computation operation can be thought of as being performed on two columns of a two-dimensional array, with the result for each value of a corresponding row of the two columns being stored in the corresponding row of a third column.

FIG. 4B represents the same basic operation as in FIG. 4A, only in this case instead of using the values previously stored in second column 43, a single value stored in register 45 is used. (Register 45 is a data storage element in the combined storage and processing device, which may be populated either by a data value from the CPU transmitted via the IDB, or by a data value from another data storage element or in-line computation unit on the combined storage and processing device.) So long as register 45 is operably connected to each row via a transfer pathway, the entire operation can still be performed in a single clock cycle. If not, it can still be performed without moving data to and from the CPU via the IDB once register 45 is populated.

FIG. 4C shows a combination of computation operations wherein multiple registers such as register 45, second register 47, and third register 49 are populated with data values and then computation operations such as are described in FIG. 4B are performed on appropriate arrays such as first array 52, with the result stored in first storage array 54, and similarly on second array 62 and second storage array 64. Registers 45-49 may also be considered a horizontal array, which can be acted upon as a single array using the methods of the invention. Again, computation efficiency is greatly increased as in a single clock cycle computation operations which would otherwise take (number of registers)×(number of rows) clock cycles can be performed.

FIG. 5 describes another application of the invention. Here, a fixed value (e.g. 0) is pushed to target column 74. This allows the CPU to send a single instruction to computation units (not shown: see FIG. 1) which causes an entire column of storage cells (or row, or array of columns and rows) to be populated with a fixed data value. If the value is zero, this "zeroes out" the target storage cells so they can be used for new data values and/or so that their previous values cannot be read. The value may be one of a plurality of predetermined fixed data values and/or a data value read from a register populated by the CPU. E.G., an in-line computation unit may populate each storage cell with the value of that row's index in an array or list. As with the other computation operations described above, the number of clock cycles it takes to populate the selected storage cell(s) with the desired data value goes from N=(number of storage cells) to N=1, or N=2 if a clock cycle must be devoted to populating a register with the desired data value.

FIGS. 6A-C show how the invention can improve operations on lists by transferring data on one axis (e.g. columns) thereby allowing storage units on a second axis (e.g. rows) to "share" data. Specifically, search techniques already known to the art are made much more efficient by using the invention to perform the techniques. By using in-line computation units, an entire column (i.e. a list or one-dimensional array) can be evaluated simultaneously for whatever condition(s) the in-line computation units can evaluate.

FIG. 6A shows a defined target value A in target cell 81. Storage cells 82 contain individual values. A and each individual value in storage cells 82 are processed by in-line computation units (not shown: the processing abstracted as evaluation step 83) according to whatever evaluation is directed by the software running on the CPU. These operations could include, but are not limited to, evaluation for: equal to A; not equal to A; less than A, or less than or equal to A; greater than A; or greater than or equal to A. The in-line computation units then push a predetermined value indicating whether the condition(s) of the evaluation were met for each storage cell. As shown in FIG. 6A, a one is pushed to positive result cells 84 for each individual value which met the condition(s,) and a zero is pushed to the result cells for each individual value which did not: only cells containing a one are shown in result cells 84. In an optional second operation, result cells 84 are summed by an in-line computation unit and the total B is stored in match result cell 85. B is the number of individual values which met the condition(s.) It is optional to push the address or index of each row as part of this operation: this allows use of the techniques described in FIGS. 6B and 6C.

FIG. 6B shows a similar process to that shown in FIG. 6A, only index storage cell 86 has been added, which allows second evaluation step 87. Index storage cell 86 contains match index value C. In second evaluation step 87, the in-line computation units look for the Cth result cell and push the individual value in the corresponding storage cell through intermediate storage cells 88 to match result cell 89. Here, match index value C=2, so individual value D, which is stored in the second matching storage cell, is pushed to match result cell 89.

FIG. 6C shows a similar process to that shown in FIG. 6A, only collated result cells 802 have been added, allowing second evaluation step 801. In second evaluation step 801, in-line computation units (not shown, the process abstracted as second evaluation step 801) push individual values for which the corresponding result cells contain a one to collated result cells 802, shifting the values in each corresponding storage cell to the collated result cell corresponding to the match index value of that storage cell. This could be done in a variety of ways, including but not limited to summing the value of all result cells above and including the corresponding result cell, and pushing the individual value to the collated result cell corresponding to the sum value so calculated.

As an example, the storage cell labeled Z corresponds to the result cell labeled E. Summing the values of E and the cells above it (here, only F) results in a value of 2. Therefore, the individual value stored in storage cell Z should be stored in the second collated result cell, also labeled Z.

In an alternate usage, the device would return an index or address of the matching storage cell (or cells) for later access and/or to allow the software running on the general purpose computing device to refer to and/or use the value in the matching storage cell in later computation operations. In the preferred embodiment, the device can return multiple instances of the index or address along the transfer pathways to an appropriate storage cell or cells. This is less useful if the sole criterion is equality, but with other criteria, the ability to retrieve by index and collate become more useful and the invention makes such operations much more efficient.

Figure 7B:
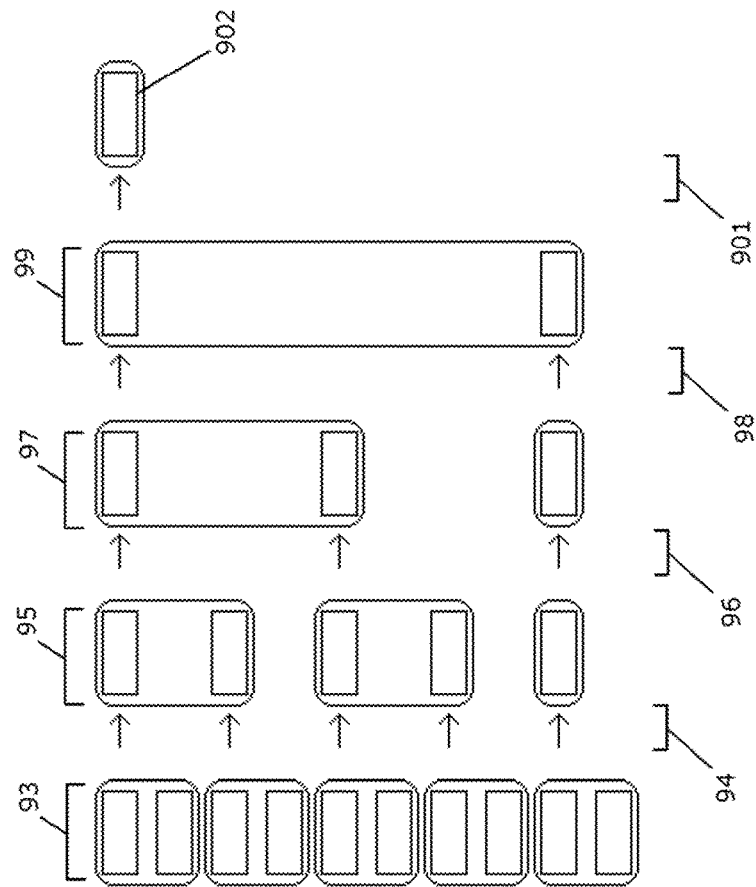
FIG. 7B depicts an abstracted flow diagram of a folding/reducing operation performed using the invention.
Figure 7A:
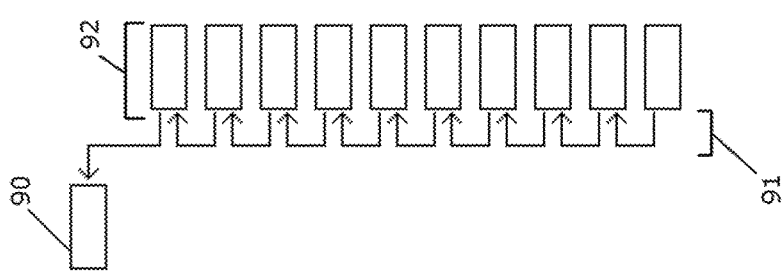
FIG. 7A depicts an abstracted flow diagram of a folding/reducing operation performed using the invention.

FIGS. 7A-7B show the operations of "folding" or "reducing" a single list, which includes, but is not limited to, such operations as finding the sum, product, minimum, or maximum of the values in the list. This can be done by direct folding, which is a serial operation that is independent of the system clock, or by deferred folding, which is a multi-step operation allowing multiple operations to be implemented, but which is dependent upon clock cycles.

FIG. 7A shows a direct folding operation. List 92 comprises multiple storage cells containing individual values. In-line computation units (not shown: the operation abstracted as direct folding step 91) read the list from its original location. The in-line computation unit at the "bottom" of the list emits the individual value it has read up along a vertical pathway connecting the in-line computation units. The next in-line computation unit performs the desired operation upon the individual value pushed to it from the first in-line computation unit and the individual value it has read, and pushes the result up to the next in-line computation unit, and so on. The last in-line computation unit, after performing the operation, pushes the result A to result storage cell 90. As an example, if the operation was addition, and each storage cell in list 92 contained the value 1, the result A would equal 10 in decimal numbers, or A in hexadecimal, or 1010 in binary, as appropriate.

The direction the in-process value travels will depend upon the actual operation being performed (e.g. addition can move either "up" or "down" and will produce the same result, but subtraction must begin at the "end" of the list which is understood to contain the primary value, as subtraction is not associative.)

FIG. 7B shows a deferred folding operation. It is required that only operations possessing the associative property be performed when performing a deferred folding operation. List 93 contains storage cells, each storage cell storing an individual value. For each pair of storage cells, an in-line computation unit (not shown: the processing abstracted as first processing step 94) performs the desired operation, specified by the software operating on the CPU of the general purpose computing device. For each pair, the value of the operation is then stored in first result list 95. This is iterated as many times as is required: here through second processing step 96 to second result list 97, then through third processing step 98 to third result list 99, then through fourth processing step 901 to fourth result list 902. Each processing step as shown in FIG. 7B can be the same operation or a different operation, as desired. For instance, if the ultimate result desired is "find the sum of the individual values in list 93," each processing step is an addition operation. If the ultimate desired result is "find the sum of the highest value in each pair of individual values in list 93," then first processing step 94 would be a comparison operation, and the remaining processing steps would be addition operations.

Figure 8:
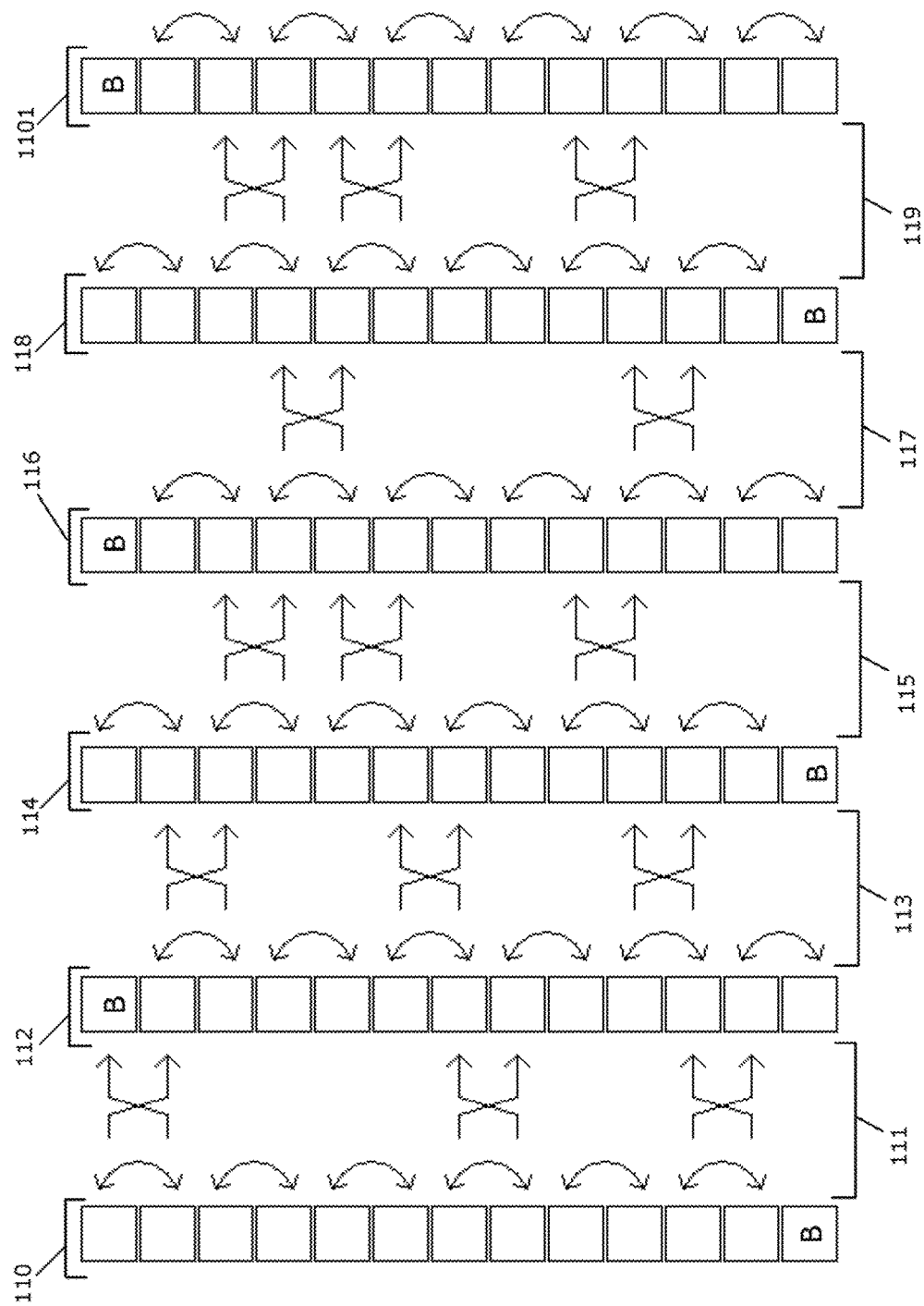
FIG. 8 depicts an abstracted flow diagram of a bubble sorting operation performed using the invention.
Figure 9:
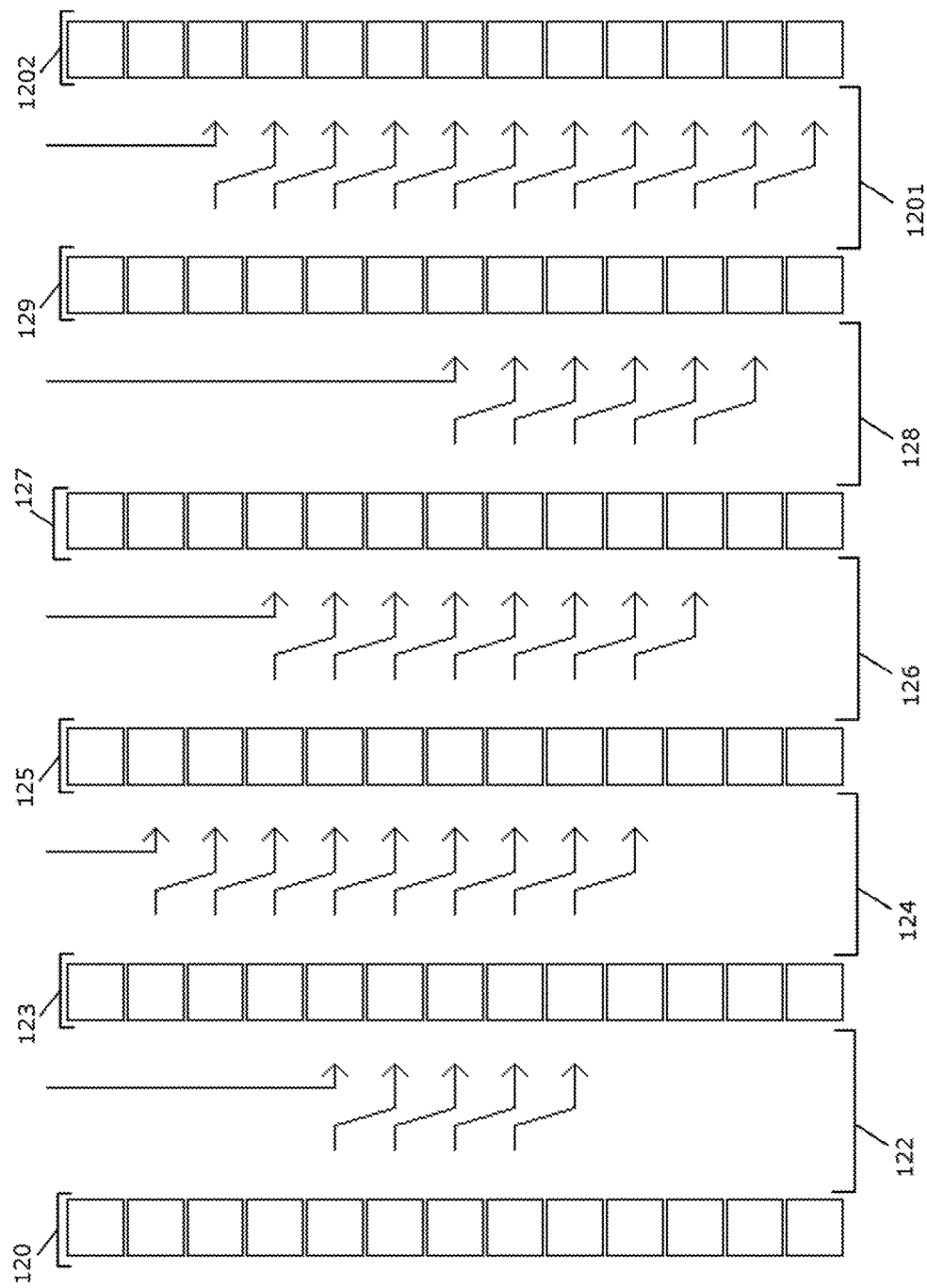
FIG. 9 depicts an abstracted flow diagram of a concurrent insertion sorting operation performed using the invention.
Figure 10:
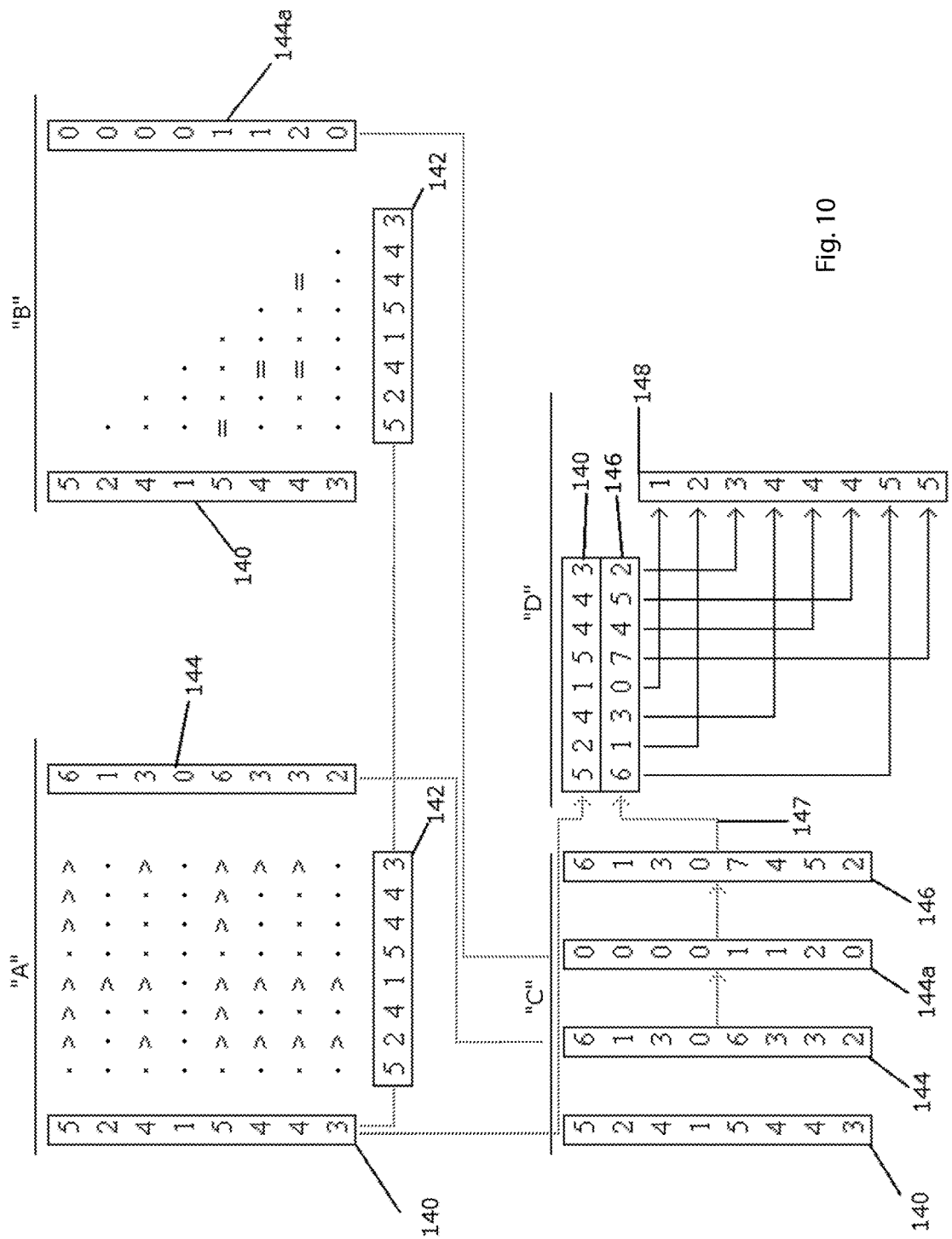
FIG. 10 depicts an abstracted flow diagram of a Cartesian sorting operation performed using the invention.

FIGS. 8-10 show sorting operations performed using the invention, using a conventional sorting technique involving pair-evaluation sorting. Sorting is one of the most common and resource-intensive tasks in computer science. The selection of the most efficient sorting method for any particular context, and its implementation, have profound effects on the speed and efficiency of computer software. Conventional sorting has been proven to run in, at best, (N Log N) clock cycles. Sorting techniques, however, largely involve evaluating pairs of individual values, and thus the benefit of the invention will become obvious from the following description. By allowing multiple comparisons simultaneously, sorting operations can be performed in not more than N clock cycles and in as little as 1 clock cycle, depending on the sorting method, the number of items, and the capacity of the hardware implementing the invention.

The operation described in FIG. 8 is called a "bubble sort." It is the simplest and least efficient method of sorting a list, but by use of the invention, its efficiency is greatly enhanced. It should be noted that any storage cell shown in FIG. 8 which contains a "B" should be understood to be a "bye," that is, a storage cell which is not acted upon in the corresponding pair-evaluation step. Whenever a group of individual values to be acted upon contains an odd number of individual values, "byes" will exist during such steps. Additionally, "byes" will exist in the end values of a group of individual values on alternating cycles.

In FIG. 8, first list 110 contains a plurality of storage cells, each storage cell containing an individual value. In-line computation units (not shown: processing abstracted as first processing step 111) compare adjacent pairs of individual values stored in the storage cells. If a given pair is in the "wrong" order relative to the desired sorting outcome, the in-line computation unit swaps them, then pushes the pair to the storage cells in second list 112. It is optional to instead retain the new values in the same storage cells: this is known as a "destructive" sort, since the original list order can no longer be retrieved. The invention makes destructive sorts much more convenient, since the entire list can be copied in a single clock cycle as described previously, and the sort can be performed on one copy of the list and the original list order retained for later reference in the other copy.

This process is repeated through computation steps 113, 115, 117, and 119, each step being performed on an intermediate list 114, 116, and 118. It is mathematically provable that if this process is performed N times, where N is the number of individual values, the list will be properly sorted. Therefore, any list which can be stored in the storage and processing device as a single row (or column) of storage cells can be sorted in not more than N clock cycles. A list which is larger than this can be broken down and sorted with more advanced techniques such as merge sorting. The ultimate result is stored in final list 1101.

FIG. 9 shows a progressive sorting operation performed with the invention. Every storage cell in first list 120 is visited once, and the individual value stored therein is pushed to its progressively sorted position in a new list. (This is known as "inserting" the value at its "insertion point.") All individual values in first list 120 are subjected to a list-wide inequality comparison (see examples in FIGS. 6A-6C.)

Using a technique similar to that known as "bit rolling," where individual values are pushed off the end of a list and then into designated open storage cells, by using the inequality comparisons performed by in-line computation units (not shown: processing abstracted as processing steps 122, 124, 126, 128, and 1201,) insertions are made to intermediate list configurations 123, 125, 127, and 129. The intermediate list configurations are not separate columns (or rows) of storage cells: they are "virtual" intermediate configurations of output list 1202. Column 1202 contains the final output of the sorting operation.

FIG. 10 shows the invention used to implement a "Cartesian Sort," a type of sort using inequality comparisons to determine the proper location of an individual value in a sorted list. Note that in this figure, multiple SPD units are abstracted as pathways and result boxes.

To perform a Cartesian sort, a list of individual values is selected and each individual value is assigned a new index value. Each individual value's new index value is equal to the number of individual values that are less than that individual value in the original list, plus the number of individual values that are equal to that individual value and occur before that individual value. If it is known that the list of individual values contains no duplicates, it is not necessary to evaluate or track the number of individual values that are equal to the individual value being assigned a new index value. The individual values are then placed into a new sorted list, with the position in the new sorted list of each individual value being equal to that individual value's new index value. Using traditional programming techniques associated with standard general-purpose computing devices, sorts such as Cartesian sorts, bubble sorts or insertion sorts can take $N^{\wedge}2$ cycles to perform, where N is the number of items in the list to be sorted.

However, using the invention a Cartesian sort of any list that will fit into a single column or row of storage cells in the combination storage and processing device can be performed in a single clock cycle or, depending on implementation and interpretation, a number of clock cycles not greater than the number of steps required to process each list comparison a single time.

List 140 is first transpositionally copied into horizontal list 142. Then in Step "A," every individual value in list 140 and every individual value in horizontal list 142 are subjected to a Greater Than evaluation by in-line computation units (not shown: abstracted as "." and ">", where "." indicates "not greater than" and ">" indicates "greater than.") For each individual value in list 140, an individual GT value is stored in GT list 144 which is equal to the number of individual values in horizontal list 142 which that individual value was greater than. Without the invention, each individual value in list 140 would have to be checked against every other individual value in list 140. Using the invention, all the individual values can be checked in a single operation.

In Step "B," individual values in list 140 and individual values in horizontal list 142 are subjected to an Equality evaluation by in-line computation units (not shown: abstracted as "." and "=", where "." indicates "not equal" and "=" indicates "equal.") Unlike Step "A," in Step "B" these evaluations are performed only on those individual values in list 140 occurring after the first individual value, and those evaluations are performed only against those individual values in horizontal list 142 occurring before the equivalent position of the individual value in list 140. For instance, the fifth individual value in list 140 would be evaluated only against those individual values in horizontal list 142 which were the transposed first, second, third, and fourth individual values from list 140. For each individual value in list 140 for which the evaluations are made, an individual EQ value is stored in EQ list 144a which is equal to the number of individual values in horizontal list 142 which that individual value was compared to and found to be equal to. As in Step "A," without the invention, each individual value in list 140 would have to be checked against every other individual value in list 140. Using the invention, all the individual values can be checked in a single operation.

In Step "C," the individual GT values in GT list 144 are added to the individual EQ values in EQ list 144a to produce index list 146, which is a list of individual index values. This can be done using those features of the invention described in FIG. 4A, where the binary operation is addition. The results are then pushed through transposition step 147 to Step "D."

In Step "D," the individual values stored in list 140 (shown transposed to a row for ease of understanding) and the corresponding individual index values in index list 146 (likewise shown transposed to a row) are pushed as individual value pairs through in-line computation units (abstracted as transfer pathways between list 140/index list 146 and sorted list 148) such that the in-line computation units move the individual values from list 140 only to the storage cell in sorted list 148 corresponding to the individual index value in the individual value pair. Sorted list 148 then contains the values in list 140, sorted in ascending order.

It will be obvious to persons of ordinary skill in the art that application of the invention allows not only mathematical computation operations to be performed more efficiently than in prior art, but also computation processes such as searching, copying, and sorting. By using computation units and/or hybrid cells which can perform inequality computation operations, an array of storage cells can be searched for a given data value in a single operation. By using computation units and/or hybrid cells which can perform greater than/less than computation operations, data values stored in an array of storage cells can be sorted in a much more efficient manner than in prior art.

This application—taken as a whole with the abstract, specification, claims, and drawings—provides sufficient information for a person having ordinary skill in the art to practice the invention disclosed and claimed herein.

Any measures necessary to practice this invention are well within the skill of a person having ordinary skill in this art after that person has made a careful study of this disclosure.

Because of this disclosure and solely because of this disclosure, modification of this system and method can become clear to a person having ordinary skill in this particular art. Such modifications are clearly covered by this disclosure.

What is claimed and sought to be protected by Letters Patent is:

1. A combination storage and processing device comprising:
   a) an integrated circuit, the integrated circuit containing a plurality of data storage elements and a plurality of in-line computation units;
   b) a plurality of transfer pathways connecting the plurality of data storage elements and the plurality of in-line computation units such that when a plurality of individual data values stored in the plurality of data storage elements are transferred through the plurality of transfer pathways into the plurality of in-line computation units, the plurality of in-line computation units will perform a computational operation on the plurality of individual data values and transfer a plurality of computed data values back to the plurality of data storage elements through the plurality of transfer pathways;
   c) a first list-defining pathway connecting at least two of the plurality of data storage elements, the first list-defining pathway comprising one of the plurality of transfer pathways, the at least two of the plurality of data storage elements connected by the first list-defining pathway comprising a first list of data storage elements;
   d) a first list subset of the plurality of in-line computation units, each of the plurality of in-line computation units in the first list subset connected to at least one of the plurality of data storage elements in the first list of data storage elements via the plurality of transfer pathways;
   e) a result list-defining pathway connecting at least two of the plurality of data storage elements not part of the first list of data storage elements, the result list-defining pathway comprising one of the plurality of transfer pathways which is not the first list-defining pathway and is not one of the plurality of transfer pathways connecting the first list subset of the plurality of in-line computation units to the first list of data storage elements; and,
   f) a result list of data storage elements comprising the at least two of the plurality of data storage elements connected by the result list-defining pathway such that the first list subset of the plurality of in-line computation units are each connected to one of the result list of data storage elements via the plurality of transfer pathways such that a plurality of data values can be stored in the first list of data storage elements, the plurality of data values can be sent to the first list subset of the plurality of in-line computation units, the first list subset of the plurality of in-line computation units can perform a computation operation on the plurality of data values generating a plurality of computed data values, and the plurality of computed data values can be sent to the result list of data storage elements.

2. The combination storage and processing device of claim 1 further comprising:
   a) a second list-defining pathway connecting at least two of the plurality of data storage elements which are not part of the first list of data storage elements or the result list of data storage elements, the second list-defining pathway comprising one of the plurality of transfer pathways which is not the first list-defining pathway or the result list-defining pathway, the at least two of the plurality of data storage elements connected by the second list-defining pathway comprising a second list of data storage elements, the second list of data storage elements storing a second plurality of data values and connected to the first list subset of the plurality of in-line computation units via the plurality of transfer pathways such that the plurality of data values and the second plurality of data values can move through the plurality of transfer pathways to the first list subset of the plurality of in-line computation units, the first list subset of the plurality of in-line computation units can perform a plurality of computations on the plurality of data values and the second plurality of data values to produce the plurality of computed data values, and the first list subset of the plurality of in-line computation units can transfer the plurality of computed data values to the result list of data storage elements.

3. The combination storage and processing device of claim 1 wherein the result list of data storage elements comprises a single result data storage element, and the first list subset of the plurality of in-line computation units perform a plurality of computations on the plurality of data values resulting in a single result data value, the first list subset of the plurality of in-line computation units storing the single result data value in the single result data storage element.

4. The combination storage and processing device of claim 2 wherein the result list of data storage elements comprises a single result data storage element, and the first list subset of the plurality of in-line computation units perform a plurality of computations on the plurality of data values and the second plurality of data values resulting in a single result data value, the first list subset of the plurality of in-line computation units storing the single result data value in the single result data storage element.

5. The combination storage and processing device of claim 1 wherein:
   a) one of the plurality of data storage elements which is not part of the first list of data storage elements or the result list of data storage elements is a target data storage element, which stores a target data value, and the target data storage element is connected to the first list subset of the plurality of in-line computation units via the plurality of transfer pathways;
   b) the plurality of data values is sent to each of the first list subset of the plurality of in-line computation units along with the target data value, each of the first list subset of the plurality of in-line computation units receiving one and only one of the plurality of data values;
   c) each of the first list subset of the plurality of in-line computation units performs the computation operation on the one and only one of the plurality of data values and the target data value, wherein the computation operation is a comparison, and produces a comparison result value which indicates the result of the comparison; and,
   d) the comparison result value is sent to one and only one member of the result list of data storage elements.

6. The combination storage and processing device of claim 1 wherein the computation operation is a duplication of one of the plurality of data values, resulting in the plurality of data values being identically copied to the plurality of computed data values.

7. The combination storage and processing device of claim 1 wherein the computation operation is a negation of one of the plurality of data values, resulting in the plurality of data values being copied to the plurality of computed data values as a list of the negation of each of the plurality of data values.

8. A general purpose computing device, the general purpose computing device comprising:
   a) A central processing unit;
   b) A persistent storage device operably connected to the central processing unit through a persistent storage bus, the persistent storage device storing a software program which can be executed by the central processing unit;
   c) A combination storage and processing device operably connected to the central processing unit through an internal data bus, the combination storage and processing device comprising a plurality of data storage elements each capable of storing one of a plurality of individual data values, a plurality of in-line computation units each capable of performing a computation operation on the plurality of individual data values, and a plurality of transfer pathways connecting the plurality of in-line computation units to the plurality of data storage elements such that the software program can issue a plurality of commands causing the central processing unit to transfer a plurality of specific data values to the plurality of data storage elements through the internal data bus and the plurality of in-line computation units to perform the computation operation on the plurality of specific data values by transferring the plurality of specific data values from the plurality of data storage elements through the plurality of transfer pathways to the plurality of in-line computation units and the plurality of in-line computation units transferring a plurality of computed data values back to the plurality of data storage elements through the plurality of transfer pathways;
   d) a first list-defining pathway connecting at least two of the plurality of data storage elements, the first list-defining pathway comprising one of the plurality of transfer pathways, the at least two of the plurality of data storage elements connected by the first list-defining pathway comprising a first list of data storage elements;
   e) a first list subset comprising at least two of the plurality of in-line computation units, each of the at least two of the plurality in-line computation units in the first list subset connected to at least one of the plurality of data storage elements in the first list of data storage elements via the plurality of transfer pathways;
   f) a result list-defining pathway connecting at least two of the plurality of data storage elements not part of the first list of data storage elements, the result list-defining pathway comprising one of the plurality of transfer pathways which is not the first list-defining pathway and is not one of the plurality of transfer pathways connecting the first list subset of the plurality of in-line computation units to the first list of data storage elements; and,
   g) a result list of data storage elements comprising the at least two of the plurality of data storage elements connected by the result list-defining pathway such that the first list subset of the plurality of in-line computation units are each connected to one of the result list of data storage elements via the plurality of transfer pathways such that a plurality of data values can be stored in the first list of data storage elements, the plurality of data values can be sent to the first list subset of the plurality of in-line computation units, the first list subset of the plurality of in-line computation units can perform the computation operation on the plurality of data values generating a plurality of computed data values, and the plurality of computed data values can be sent to the result list of data storage elements, such that the result list of data storage elements can send the plurality of computed data values back to the central processing unit through the internal data bus.

9. The general purpose computing device of claim 8, wherein the result list of data storage elements comprises a single result data storage element, and the first list subset of the plurality of in-line computation units perform a plurality of computations on the plurality of data values resulting in a single result data value, the first list subset of the plurality of in-line computation units storing the single result data value in the single result data storage element.

10. The general purpose computing device of claim 8, wherein:
   a) one of the plurality of data storage elements which is not part of the first list of data storage elements or the result list of data storage elements is a target data storage element, which stores a target data value, and the target data storage element is connected to the first list subset of the plurality of in-line computation units via the plurality of transfer pathways;
   b) the plurality of data values is sent to each of the first list subset of the plurality of in-line computation units along with the target data value, each of the first list subset of the plurality of in-line computation units receiving one and only one of the plurality of data values;

c) each of the first list subset of the plurality of in-line computation units performs the computation operation on the one and only one of the plurality of data values and the target data value, wherein the computation operation is a comparison, and produces a comparison result value which indicates the result of the comparison; and, d) the comparison result value is sent to one and only one member of the result list of data storage elements.

* * * * *